(12) United States Patent
Cox

(10) Patent No.: US 6,906,655 B1
(45) Date of Patent: Jun. 14, 2005

(54) PLURAL CHANNEL ANALOG-TO-DIGITAL CONVERTER, METHOD AND METER EMPLOYING AN INPUT CHANNEL WITH A PREDETERMINED DIRECT CURRENT BIAS

(75) Inventor: Roger W. Cox, Oakdale, PA (US)

(73) Assignee: Eaton Corporation, Cleveland, OH (US)

(*) Notice: Subject to any disclaimer, the term of this patent is extended or adjusted under 35 U.S.C. 154(b) by 0 days.

(21) Appl. No.: 10/740,130

(22) Filed: Dec. 18, 2003

(51) Int. Cl.⁷ .............................................. H03M 1/12

(52) U.S. Cl. ..................................................... 341/155

(58) Field of Search ............................... 341/155, 156, 341/158

(56) References Cited

U.S. PATENT DOCUMENTS 5,099,239 A * 3/1992 Bruce et al. ................. 341/155

OTHER PUBLICATIONS

Analog Devices, Inc., "Six–Input Channel Analog Front End", AD73360L, 2000, pp. 1–32.

* cited by examiner

Primary Examiner—Peguy Jeanpierre
Assistant Examiner—Joseph Lauture
(74) Attorney, Agent, or Firm—Martin J. Moran

(57) ABSTRACT

A meter for power lines includes first input channels having AC signals with DC values of about zero. A second input channel has an analog output with a predetermined non-zero DC bias value. Plural biasing and scaling circuits input the AC signals and output corresponding analog outputs. Plural analog-to-digital converters input the corresponding analog outputs and output corresponding digital values. A serial output circuit serially communicates the corresponding digital values for a first set of A/D conversions before serially communicating digital values for a subsequent second set of conversions without providing any synchronization of the corresponding digital values for both the first and second sets of conversions. A serial input circuit serially receives the serially communicated digital values and saves the same in a memory. A processor averages the digital values for the channels and determines whether only the average associated with the second channel has the DC bias value.

29 Claims, 9 Drawing Sheets

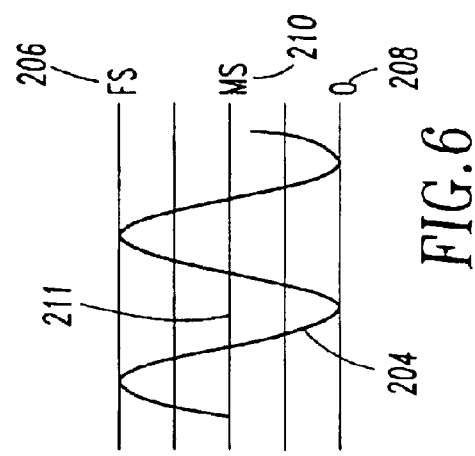
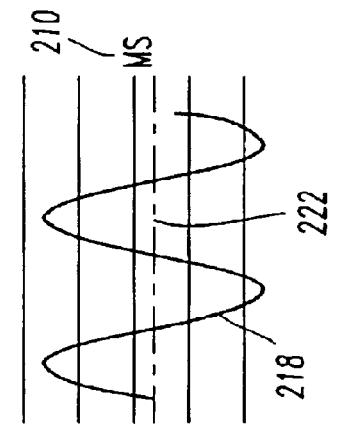
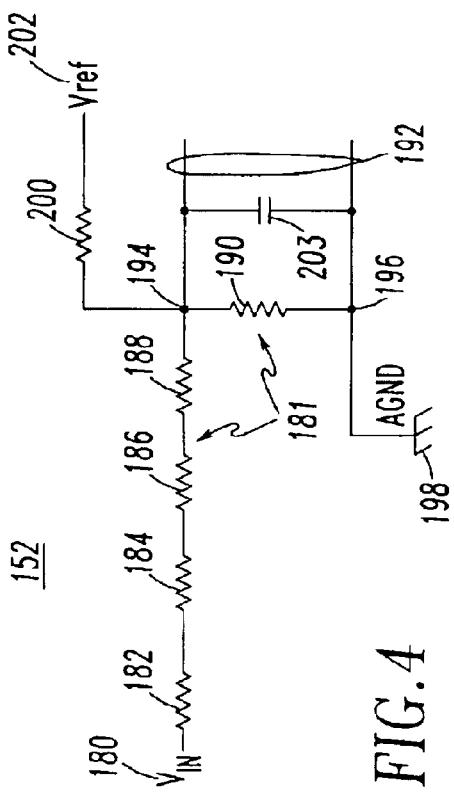
FIG.4
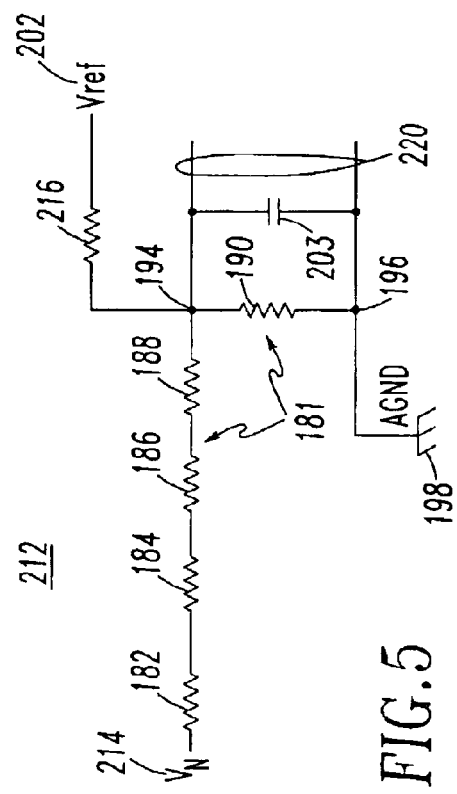
FIG.5

PLURAL CHANNEL ANALOG-TO-DIGITAL CONVERTER, METHOD AND METER EMPLOYING AN INPUT CHANNEL WITH A PREDETERMINED DIRECT CURRENT BIAS

BACKGROUND OF THE INVENTION

1. Field of the Invention

The invention relates to analog-to-digital converters and, more particularly, to meters employing analog-to-digital converters for a plurality of alternating current power lines. The invention also relates to a method of analog-to-digital conversion and, more particularly, to such a method that synchronizes serially communicated output digital values from analog-to-digital conversions.

2. Background Information

Whenever there are serial streams of data for a plurality of different channels, synchronization of the data is an issue. A typical mechanism for resolving this issue is to employ dedicated hardware to provide a suitable synchronization signal. For example, if the starting point of a clock associated with one set of serial data for the different channels of an analog-to-digital (A/D) converter is known, then the dedicated hardware can be employed to assure synchronization (and, thus, provide a subsequent starting point) for a subsequent second set of data for those different channels. However, in the absence of such a synchronization signal, another mechanism is required.

It is known to provide an A/D converter having a plurality of input analog channels and a single addressable digital output.

Channel synchronization can apply to any count of plural channels. For example, FIG. 1 shows, for six channels, the relative timing of serial data including a serial enable (SE) input signal 2, a serial data output frame sync (SDOFS) output signal 4, and a serial data output (SDO) signal 6 from a six-channel, serial output A/D converter (not shown) for two successive sets 8,10 of six samples. Serial data is normally read from the A/D converter with simultaneously sampled channels appearing in consecutive order (i.e., samples 12,14,16,18,20,22 of the first set 8; samples 24,26, 28,30,32,34 of the second set 10). This process is continuous until the sampling system of the A/D converter is reset or loses power.

Alternatively, some A/D converters output one SDOFS output signal for only the first of six samples.

However, other than the initial synchronization of the six channels via the SE input signal 2, there is no physical mechanism to verify that the sampled six channels are in the correct order (e.g., the correct samples 12,14,16,18,20,22 of one set, such as 8, versus, for example, samples 16,18,20,22 of one set, such as 8, erroneously combined with samples 24,26 of a subsequent set, such as 10) in the SDO signal 6. For example, if noise or another malfunction results in extra or missing SDOFS output signal(s) 4, then the hardware (not shown) downstream of the A/D converter (not shown) has no mechanism to detect this error. Hence, it is believed that only some hypothetical interpretation of the data (i.e., the samples 12,14,16,18,20,22 and/or the samples 24,26,28,30, 32,34) from the SDO signal 6 might reveal whether the channel data is in the appropriate order for each of the sets 8,10 of samples.

There is room for improvement in analog-to-digital converters, meters employing analog-to-digital converters and methods of analog-to-digital conversion.

SUMMARY OF THE INVENTION

These needs and others are met by the present invention, which introduces a unique direct current offset to one input channel, such as, for example, to one of the alternating current waveforms input by a plurality of input channels of a serial output analog-to-digital (A/D) converter. Hence, by determining the presence of the direct current offset on the proper input channel, lost data may be avoided along with the need to reset and resynchronize the A/D converter.

As one aspect of the invention, an analog-to-digital converter apparatus comprises: a plurality of first input channels, each of the first input channels including an alternating current signal having a direct current value of about zero; a second input channel having a predetermined direct current bias value, which is different than zero; means for biasing and scaling each of the first and second input channels and providing a plurality of analog outputs; means for providing a plurality of analog to digital conversions for each of the analog outputs and outputting a plurality of digital values; means for serially communicating the digital values for a first set of the analog to digital conversions before serially communicating the digital values for a subsequent second set of the analog to digital conversions without providing any synchronization of the digital values for both of the first and second sets of the analog to digital conversions; and means for serially receiving the serially communicated digital values and saving the same.

The second input channel may include a predetermined direct current voltage. The second input channel may include an alternating current signal having a direct current value of about zero, and the second input channel may be biased by a predetermined direct current value, which is different than zero.

As another aspect of the invention, a method of analog-to-digital conversion comprises: employing a plurality of first input channels, each of the first input channels including an alternating current signal having a direct current value of about zero; employing a second input channel having a predetermined direct current bias value, which is different than zero; biasing and scaling each of the first input channels and providing a plurality of analog outputs; providing a plurality of analog to digital conversions for each of the analog outputs and the second input channel and outputting a plurality of output digital values; serially communicating the output digital values for a first set of the analog to digital conversions before serially communicating the output digital values for a subsequent second set of the analog to digital conversions without providing any synchronization of the digital values for both of the first and second sets of the analog to digital conversions; serially receiving the serially communicated output digital values and storing corresponding input digital values for each of the first and second input channels; and processing the input digital values.

The method may further comprise averaging the input digital values for each of the first and second input channels; and identifying from the averaged input digital values one or more of the first and second input channels having a direct current offset value, which is greater than a predetermined value.

The method may further comprise inputting a plurality of alternating current line signals at the first input channels; employing a line cycle with the line signals; selecting a time period corresponding to an integer count of the line cycle; and averaging the input digital values over the time period.

The method may further comprise determining whether one or more of the first input channels has a direct current offset value, which is greater than the predetermined value.

The method may further comprise determining that the second input channel has a direct current offset value, which is less than the predetermined value; determining that only one of the first input channels has the direct current offset value, which is greater than the predetermined value; and responsively rearranging the input digital values for the first input channels for the time period.

The method may further comprise determining that none of the first input channels has the direct current offset value, which is greater than the predetermined value; determining that the second input channel has a direct current offset value, which is greater than the predetermined value; and employing the input digital values for the first input channels for the time period.

The method may further comprise determining that more than one of the first input channels has the direct current offset value, which is greater than the predetermined value; and responsively discarding the input digital values for the first input channels for the time period.

As another aspect of the invention, a meter for a plurality of power lines comprises: a plurality of first input channels, each of the first input channels including an alternating current signal having a direct current value of about zero, the first input channels include a plurality of alternating current line voltage signals and a plurality of alternating current line current signals; a second input channel having an analog output with a predetermined direct current bias value, which is different than zero; a plurality of biasing and scaling circuits each of which inputs a corresponding one of the alternating current line voltage signals and the alternating current line current signals, and outputs a corresponding analog output; a plurality of analog to digital converters each of which inputs a corresponding one of the analog outputs of the biasing and scaling circuits and the second input channel and outputs a corresponding digital value; a serial output circuit serially communicating the corresponding digital values for a first set of analog to digital conversions before serially communicating the digital values for a subsequent second set of the analog to digital conversions without providing any synchronization of the corresponding digital values for both of the first and second sets of the analog to digital conversions; a memory, and a serial input circuit serially receiving the serially communicated digital values and saving the same in the memory.

BRIEF DESCRIPTION OF THE DRAWINGS

A full understanding of the invention can be gained from the following description of the preferred embodiments when read in conjunction with the accompanying drawings in which:

FIG. 4 is a block diagram in schematic form of an analog bias and scaling circuit for the power system voltage inputs of the A/D converter of FIG. 2.

FIG. 5 is a block diagram in schematic form of an analog bias and scaling circuit including a direct current bias for the power system neutral input of the A/D converter of FIG. 2.

FIGS. 6 and 7 are plots of voltage versus time for the circuits of FIGS. 4 and 5, respectively.

DESCRIPTION OF THE PREFERRED EMBODIMENTS

Figure 2:
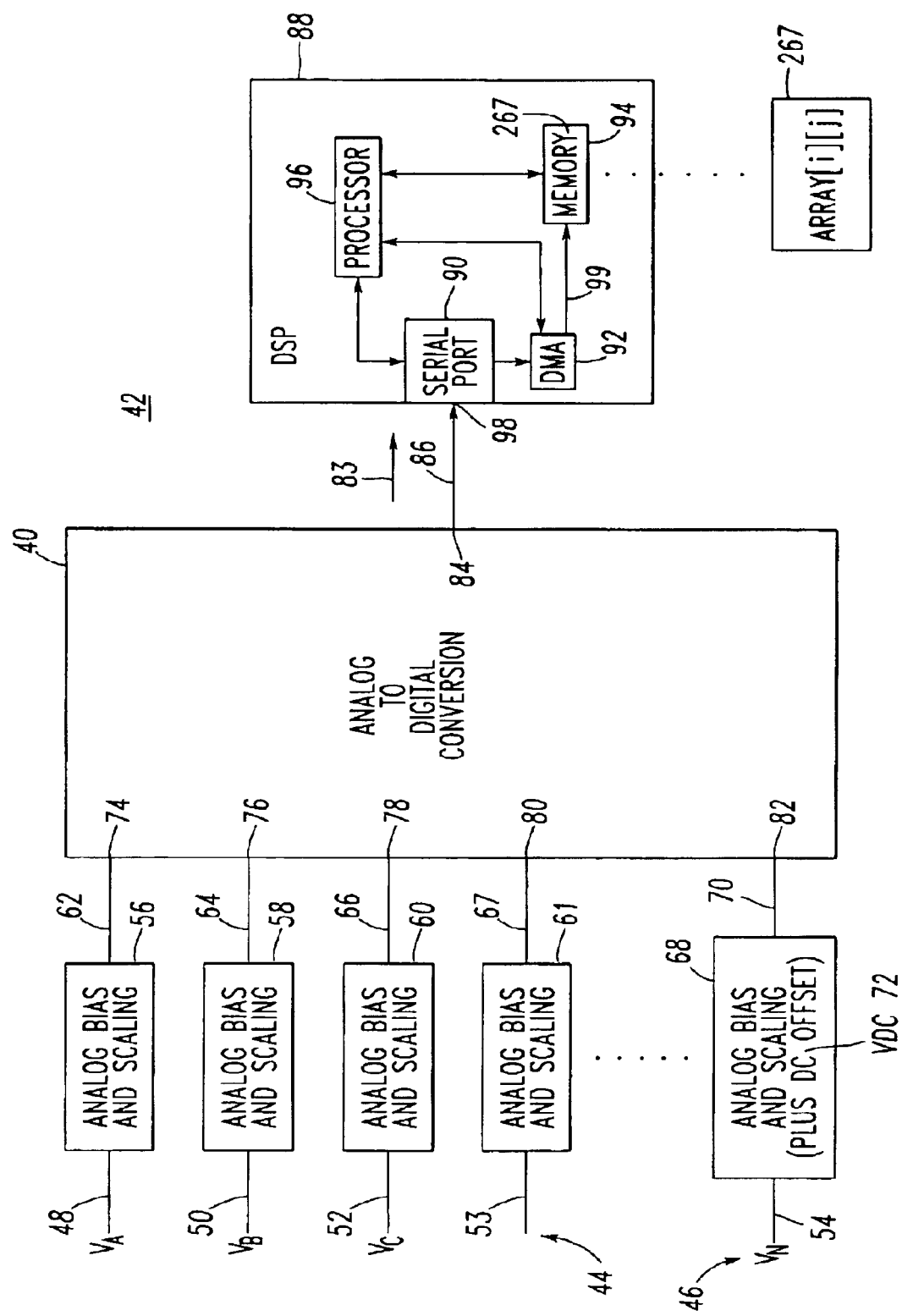
FIG. 2 is a block diagram of a plural channel serial output A/D converter and system in accordance with the present invention.

Referring to FIG. 2, a plural input channel, single serial output analog-to-digital (A/D) converter 40 and A/D converter system 42 are shown. The system 42 includes a plurality of first input channels 44 and a second input channel 46. The first input channels 44 include alternating current signals having a direct current value of about zero. The second input channel 46 has a predetermined direct current bias value, which is different than zero.

For example, the first input channels 44 include a plurality of alternating current (e.g., 50 Hz; 60 Hz; 400 Hz) line voltage (e.g., 110 VAC; 220 VAC; 480 VAC; 600 VAC) signals $V_A$ 48, $V_B$ 50, $V_C$ 52 and 53. In this example, the signals 48,50,52 are from a three-phase AC power source (not shown). The second input channel 46 includes an alternating current line voltage signal $V_N$ 54, which, for example, corresponds to a neutral line (not shown) of the AC power source.

The system 42 also includes a plurality of analog bias and scaling circuits 56,58,60,61 for biasing and scaling the signals 48,50,52,53 and providing corresponding analog outputs 62,64,66,67, respectively. In accordance with an important aspect of this embodiment, the system 42 further includes an analog bias and scaling circuit 68 for biasing and scaling the signal 54 and providing a corresponding analog output 70. In this example, the alternating current line voltage signal $V_N$ 54 has a direct current value of about zero, and the second input channel 46 is biased by a predetermined direct current bias value, such as predetermined direct current voltage VDC 72, which is different than zero (e.g., a suitable percentage of the full scale range of the analog outputs 62,64,66,67,70).

The A/D converter 40 includes a plurality of analog inputs 74,76,78,80,82 for the respective analog outputs 62,64,66, 67,70, and a serial data output (SDO) 84. As will be described in further detail, below, in connection with FIGS. 3 and 14, the A/D converter 40 functions to provide a plurality of analog to digital conversions for each of the analog outputs 62,64,66,67,70 and to provide a plurality of corresponding digital values 83. In turn, in a similar manner as was discussed above in connection with the SDO signal 6 of FIG. 1, the A/D converter 40 functions to serially communicate those digital values 83 from the serial data output 84 for a first set of the analog to digital conversions before serially communicating the digital values for a subsequent second set of the analog to digital conversions, without providing any synchronization of the digital values 83 for both of the first and second sets of the analog to digital conversions. Hence, the serial data output 84 includes a serial data stream 86, which provides no synchronization of the sequential sets of the digital values 83 for the first and second input channels 44,46.

The system 42 further includes a suitable circuit, such as, for example, a processor (e.g., digital signal processor (DSP) 88), which serially receives the serially communicated digital values 83 from the serial data stream 86 and saves the same. In this example, the DSP 88 includes a serial port 90, a direct memory access (DMA) controller 92, a memory 94 and a processor 96. The serial port 90 includes an input 98, which serially receives the serially communicated digital values 83 from the serial data output 84. The serial port 90 converts the serial data stream 86 to a sequence of digital values 99, which are transferred by the DMA controller 92 for storage in the memory 94 as input digital values (in an array 267) for subsequent processing by the processor 96. In this manner, the serial port 90 and the DMA controller 92 move streams of serial data into the memory 94.

Although the DSP 88 is shown, any suitable processor and/or digital circuit may be employed for serially receiving and manipulating the serial data stream 86.

The A/D digital values 83 in the serial data stream 86 are from the plural A/D channels (not shown) of the A/D converter 40. These values 83 stream through the single serial port 90, in order that the data from all channels 44,46 is in consecutive memory locations in the memory array 267. By employing DC offset keying with the single second channel 46, it is possible to determine if the data samples for the first channels 44 are in their intended locations in the memory array 267. Furthermore, as will be discussed below in connection with FIGS. 12A and 12B, because the data is in consecutive memory locations, a detected shift in the data samples may readily be corrected.

Figure 3:
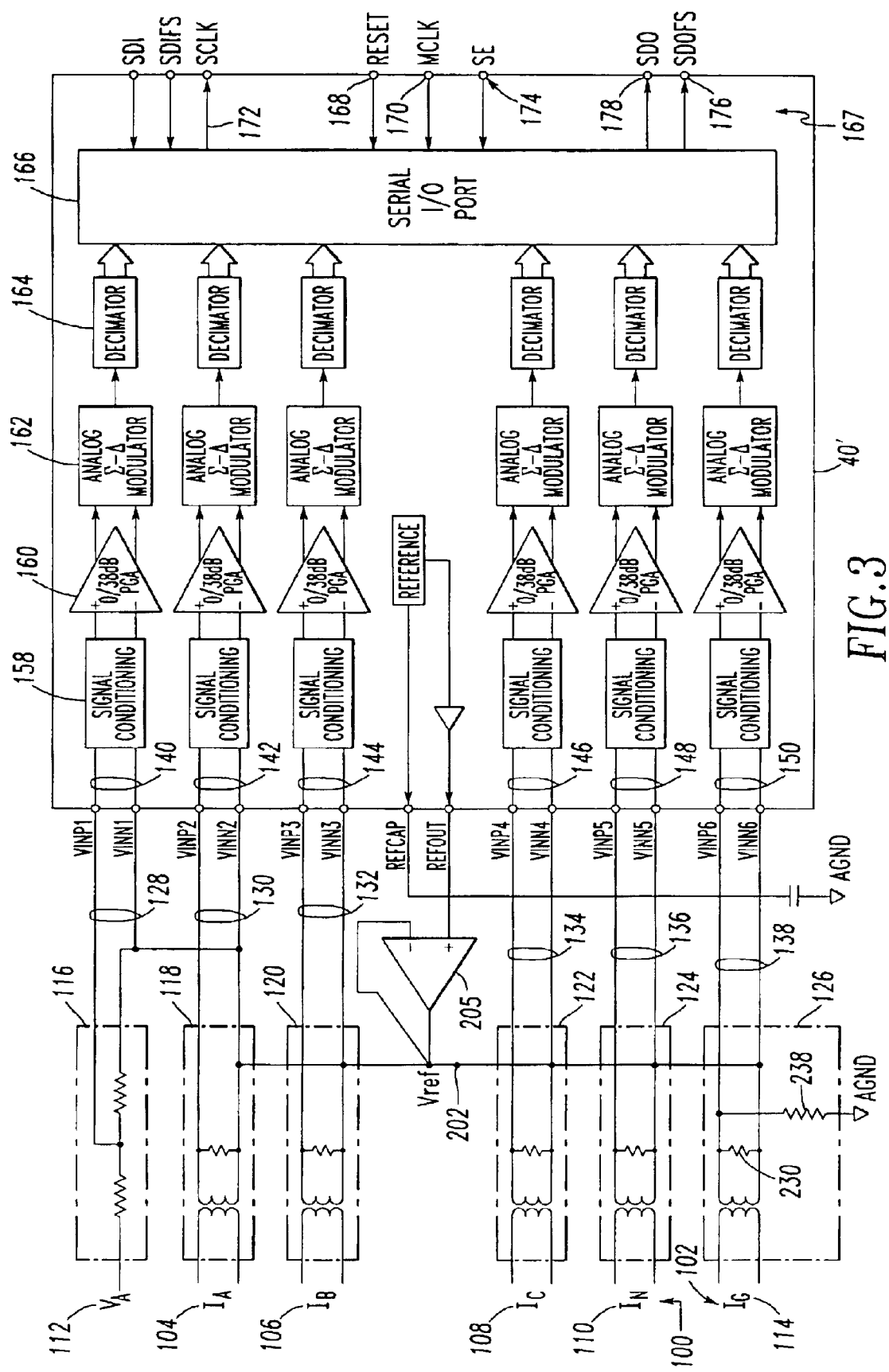
FIG. 3 is a block diagram of a six channel serial output A/D converter and system in accordance with another embodiment of the invention.

FIG. 3 shows an example of a six channel serial output A/D converter 40' including five first input channels 100 and a second input channel 102. The A/D converter 40' in this example is a model AD73360L six-input channel analog front end marketed by Analog Devices of Norwood, Mass. The first input channels 100, in this example, include a plurality of alternating current line current signals $I_A$ 104, $I_B$ 106, $I_C$ 108 and $I_N$ 110, and an alternating current line voltage signal $V_A$ 112. These alternating current line current signals 104 and 106,108,110 correspond, for example, to the alternating current line voltage signal 112 and the alternating current line voltage signals 50,52,54 of FIG. 2, respectively. The second input channel 102, in this example, includes an alternating current line current signal $I_G$ 114, which corresponds to a ground line (not shown) of a three-phase AC power source (not shown). Here, the signal $I_G$ 114 has a direct current value of about zero.

Operatively associated with the first and second input channels 100,102 are a plurality of analog bias and scaling circuits 116,118,120,122,124,126 for biasing and scaling the analog input signals 112,104,106,108,110,114 and providing corresponding analog outputs 128,130,132,134,136,138, respectively. In turn, such analog outputs 128,130,132,134, 136,138 are input by respective analog inputs 140,142,144, 146,148,150 of the A/D converter 40'. The circuit 116 is similar to the circuit 152 of FIG. 4. The circuits 118,120, 122,124 are similar to the circuit 154 of FIG. 8. The circuit 126 is similar to the circuit 156 of FIG. 9. In accordance with an important aspect of this embodiment, that circuit 126 biases the second input channel 102 with a predetermined direct current bias value, which is different than zero. That bias value is determined by a reference voltage 202 from a buffer amplifier 205, and by resistors 230,238.

EXAMPLE 1

The AD73360L A/D converter 40' is a six-input channel, 16-bit, analog front end including six independent encoder channels corresponding to the six analog inputs 140,142, 144,146,148,150. As shown following the analog input 140, each of these channels includes a signal conditioner 158, a switched capacitor programmable gain amplifier (PGA) 160, a sigma-delta analog-to-digital (A/D) converter (ADC) 162 and a decimator 164. An on-board digital filter (not shown), which forms part of the sigma-delta ADC 162, also performs critical system-level filtering. Each of the ADCs, such as 162, corresponds to one of the alternating current signals of the first and second input channels 100,102. A serial I/O port 166 receives digital values from the decimators, such as 164, and provides a suitable interface 167 to a processor (not shown) and/or another cascaded A/D converter (not shown).

The interface 167 includes a RESET input 168, which receives an active low reset signal, in order to reset the entire A/D converter 40' including control registers (not shown) and other digital circuitry (not shown). A MCLK input 170 receives a master clock input from a suitable external clock signal source (not shown). A SCLK output 172 provides an output serial clock, which has a rate that determines the serial transfer rate to/from the serial I/O port 166. The frequency of the SCLK output 172 is equal to the frequency of the master clock MCLK input 170 divided by an integer number, which is the product of an external master clock rate divider (not shown) and a serial clock rate divider (not shown).

Figure 1:
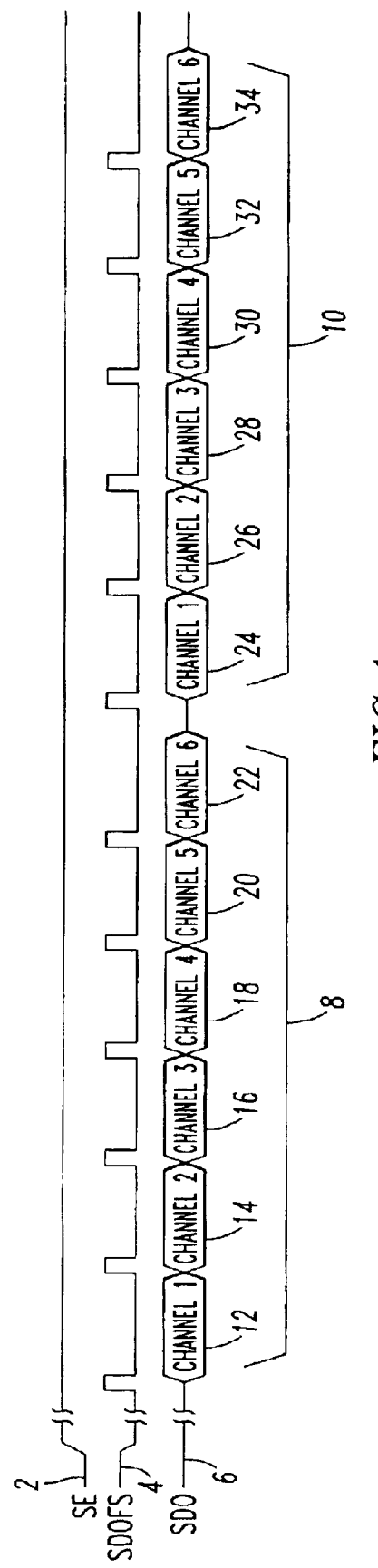
FIG. 1 is a timing diagram of serial data including a serial enable (SE) input signal, a serial data output frame sync (SDOFS) output signal and a serial data output (SDO) signal of a six-channel, serial output A/D converter for two successive sets of six samples.

Similar to the SE input signal 2 of FIG. 1, the SE input 174 is an asynchronous input enable for the serial I/O port 166. When the SE input 174 is set low, the outputs of the port 166 are three-stated and the inputs thereof are ignored. When the SE input 174 is set high, the control and data registers (not shown) of the port 166 are at their original values. Similar to the SDOFS output signal 4 of FIG. 1, the SDOFS output 176 provides the framing signal output for serial transfers on the SDO output 178. The signal of the SDOFS output 176 is one bit wide and is active one SCLK period before the first bit (i.e., most significant bit in the example) of each. output word. This signal is referenced to the positive edge of the signal of the SCLK output 172. The SDO output 178 provides a serial data output for data (e.g., a serial stream of digital values) and control information to be output and clocked on the positive edge of the signal on the SCLK output 172 when the signal on the SE input 174 is set high.

Referring to FIG. 4, the analog bias and scaling circuit 152 is for a power system alternating current line voltage input, $V_{IN}$ 180, such as the input signals 48,50,52,53 of FIG. 2 or the input signal 112 of FIG. 3. The circuit 152 includes a divider 181 formed by resistors 182,184,186,188,190 and an output 192 defined by nodes 194 and 196. The node 196 is electrically connected to a suitable analog ground AGND 198. The circuit 152 suitably reduces the alternating current voltage of the corresponding alternating current line voltage input 180. Another resistor 200 is electrically connected between the divider node 194 and the direct current reference voltage, Vref 202, which biases the differential output 192 to be at least zero volts. The output 192 may include a filter capacitor 203, as shown. The incoming AC waveforms of the input signals 48,50,52,53 of FIG. 2 or the input signal 112 of FIG. 3 have no inherent DC offset, in order that any long-term DC offset is assumed to be a measurement error. This is true for the AC voltage of the voltage input $V_{IN}$ 180, which is measured through the voltage divider, 181, and for the AC current of the current input $I_{IN}$ 203 of the circuit 154 of FIG. 8.

For example, as shown in FIG. 6, the signal 204 of the output 192 of FIG. 5 has a sinusoidal waveform, which ranges between a peak full scale (FS) value 206 and a minimum value (0) 208. The average value of the signal 204 is preferably selected by the circuit 152 (FIG. 5) to provide a mid scale (MS) value 210 of the corresponding A/D converter, such as 40 or 40'. For example, if a 16-bit A/D converter is employed, then the minimum value (0) 208 is 0000H, the mid scale (MS) value 210 is 7FFFH, and the peak full scale (FS) value 206 is FFFFH.

Figure 10:
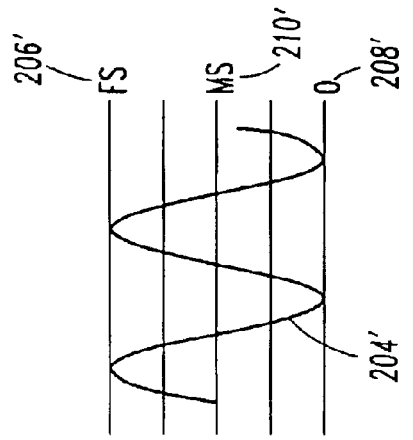
FIGS. 10 and 11 are plots of differential output voltage versus time for the circuits of FIGS. 8 and 9, respectively.

As another example, as shown in FIG. 10, the signal 204' of the output 192' of the circuit 154 has a sinusoidal waveform, which ranges between a peak full scale (FS) value 206' and a minimum value (0) 208'. The average value of the signal 204' is preferably selected by the circuit 154 to provide a mid scale (MS) value 210' of the corresponding A/D converter, such as 40'.

FIG. 5 shows an analog bias and scaling circuit 212 for a power system alternating current line voltage input, $V_N$ 214, such as the input alternating current line voltage signal $V_N$ 54 of FIG. 2 for a neutral line of an AC power source (not shown). The circuit 212 is structurally very similar to the circuit 152 of FIG. 4, with one exception. In FIG. 4, the resistors 190,200 have about the same resistance values, in order that the signal 204 (FIG. 6) from the output 192 has an average value 211, which is about equal to the mid scale (MS) value 210. In FIG. 5, the resistors 190,216 have different resistance values (e.g., the resistance of the resistor 216 is suitably greater than the resistance of resistor 190), in order that the signal 218 (FIG. 7) from the output 220 has an average value, which is suitably less than the mid scale (MS) value 210. For example, if a 16-bit A/D is employed, then the (MS) value 210 is 7FFFH, and the average value 222 is about 45% of the peak full scale (FS) value 206, FFFFH of FIG. 6, or about 7332H in this example. In other words, the divider output 220 is biased to be a predetermined DC voltage.

Figure 12A:
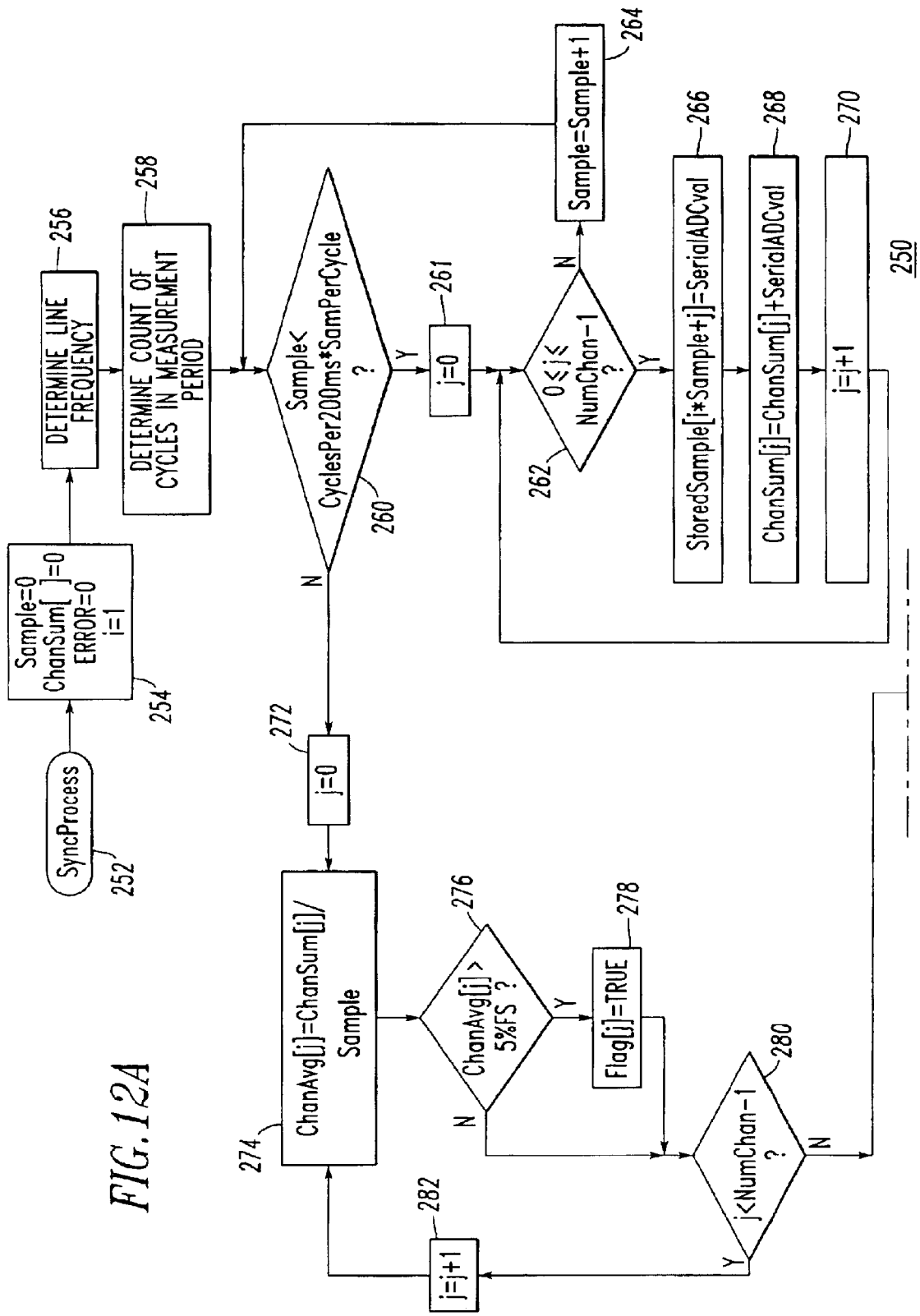
FIGS. 12A and 12B combine to form a flowchart of software executed by the processor of FIG. 2.

Preferably, relatively low-amplitude AC signals are employed in the synchronization channel through an intentional DC offset. Furthermore, a signal having zero AC signal is most preferred, since it provides a DC measure that is independent of time. Another reason is that a DC offset having a relatively small AC signal will not approach the minimum or maximum values of the A/D converter numbering system (e.g., where, for example, for a 16-bit system, 7FFFH is the mid scale (MS) value, which is defined to be zero). Since, for example, $V_N$ 54 (FIG. 2) and $I_G$ 114 (FIG. 3) are usually about zero, each is an example of a preferred synchronization channel. Furthermore, the DC measure over an integer number of cycles is determined by a frequency measurement at step 256 (FIG. 12A). If the frequency measurement is in error or delayed, then the DC component could be off by a significant amount.

In view of the types of the power line voltage signal $V_{IN}$ 180 and the neutral voltage signal $V_N$ 214 of respective FIGS. 4 and 5, the peak to peak value of the signal 204 (FIG. 6) may be at or about the peak full scale (FS) value 206, while the peak to peak value of the signal 218 (FIG. 7) is typically much less than the peak full scale (FS) value 206. However, the average value of the signal 204 is essentially the MS value 210 or is essentially 50% of the FS value 206, while the average value of the signal 218 is intentionally biased to be different from the MS value 210 (e.g., about 45% of the FS value 206). Although 45% is disclosed, any suitable percentage (e.g., without limitation, 25%; 40%; 48%; 49%; 51%; 52%; 60%; 75%) or offset above or below the MS value 210 may be employed.

Figure 8:
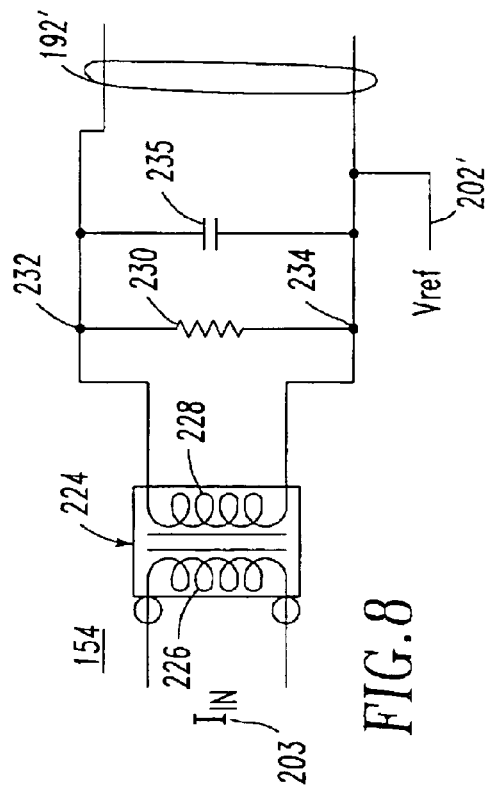
FIG. 8 is a block diagram in schematic form of an analog bias and scaling circuit for the power system current inputs of the A/D converter of FIG. 3.

Referring to FIG. 8, the analog bias and scaling circuit 154 is for a power system alternating current line current input, $I_{IN}$ 203, such as the input signals 104,106,108,110 of FIG. 3. The circuit 154 includes a current transformer 224 having a primary winding 226, a secondary winding 228 and a burden resistor 230. The terminals 232,234 of the burden resistor 230 are electrically connected in parallel with the secondary winding 228. Also, the second terminal 234 is biased by a direct current reference voltage, Vref 202', which may be the same as the reference voltage, Vref 202 of FIGS. 4 and 5. The reference voltage 202' biases the signal 204' (FIG. 10) of the output 192' of the circuit 154, in order that the average value of the signal 204' is the mid scale (MS) value 210' (FIG. 10) of the corresponding A/D converter (not shown). The output 192' may include a filter capacitor 235, as shown.

Figure 11:
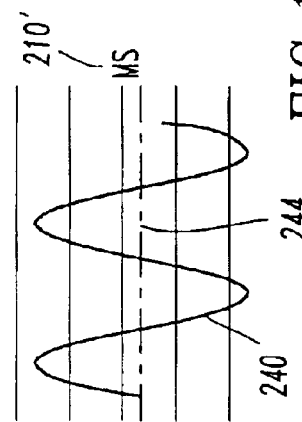
Figure 9:
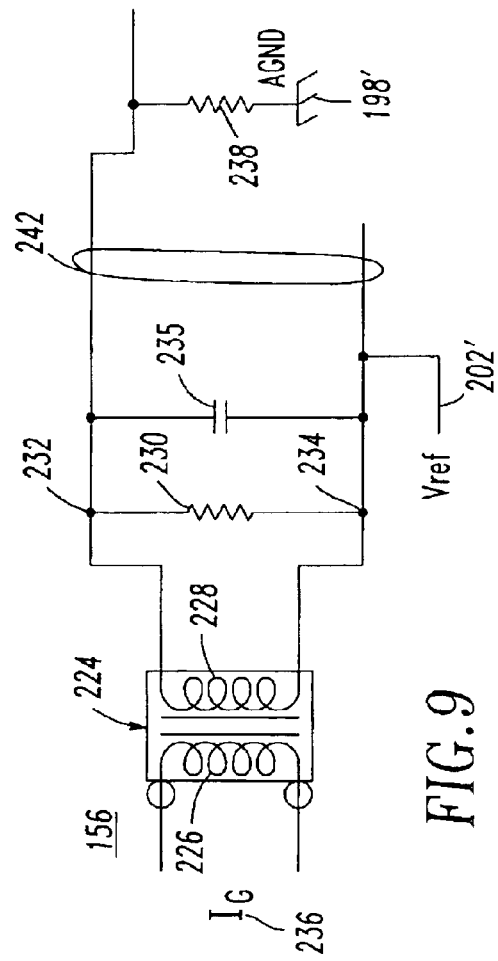
FIG. 9 is a block diagram in schematic form of an analog bias and scaling circuit including a direct current bias for the power system ground current input of the A/D converter of FIG. 3.

FIG. 9 shows the analog bias and scaling circuit 156 for the power system alternating current line current input, $I_G$ 236, such as the input signal 114 of FIG. 3. The circuit 156 is structurally very similar to the circuit 154 of FIG. 8, with one exception. The first terminal 232 of the burden resistor 230 is electrically connected by a resistor 238 to an analog ground 198', which may be the same as the analog ground 198 of FIGS. 4 and 5. This biases the output of the circuit 156 to a predetermined voltage, which provides a predetermined DC bias for the input 150 of the A/D converter 40' of FIG. 3. In FIG. 9, the resistors 238,230 have different resistance values (e.g., the resistance of the resistor 238 is suitably greater (e.g., 10 times) than the resistance of resistor 230), in order that the signal 240 (FIG. 11) from the output 242 has an average value, which is suitably less than the mid scale (MS) value 210'. For example, if a 16-bit A/D is employed, then the (MS) value 210' is 7FFFH, and the average value 244 is about 45% of the peak full scale (FS) value 206', FFFFH of FIG. 10, or about 7332H in this example. In other words, the circuit output 242 is biased to be a predetermined DC voltage.

In view of the different types of the power line current signal $I_{IN}$ 203 and the ground current signal $I_G$ 236 of respective FIGS. 8 and 9, the peak to peak value of the signal 204' may be at or about the peak full scale (FS) value 206' of FIG. 10, while the peak to peak value of the signal 240 is typically much less than the peak full scale (FS) value 206'. However, the average value of the signal 204' of FIG. 10 is essentially the MS value 210' or essentially 50% of the FS value 206', while the average value of the signal 240 of FIG. 11 of the output 242 is intentionally biased to be different from the MS value 210' (e.g., about 45% of the FS value 206' of FIG. 10). Although 45% is disclosed, any suitable percentage (e.g., without limitation, 25%; 40%; 48%; 49%; 51%; 52%; 60%; 75%) or offset above or below the MS value 210' may be employed.

As shown in FIGS. 5 and 9, the respective bias resistors 216 and 238 introduce suitable DC offset voltages. For the application of measuring electrical behavior in three-phase power systems, for example, such a DC offset may be introduced to either an unused A/D channel or to an A/D channel that is not operatively associated with one of the three power-line phases. For example, the offset is introduced to $V_N$ 214 of FIG. 5, $V_{NG}$ (not shown) or $I_G$ 236 of FIG. 9 rather than the phase voltage signals $V_A$ 48, $V_B$ 50, $V_C$ 52, $V_{AN}$ (not shown), $V_{BN}$ (not shown) or $V_{CN}$ (not shown), or the phase current signals $I_A$ 104, $I_B$ 106, $I_C$ 108 or $I_N$ 110 of FIGS. 2 and 3.

Figure 12B:
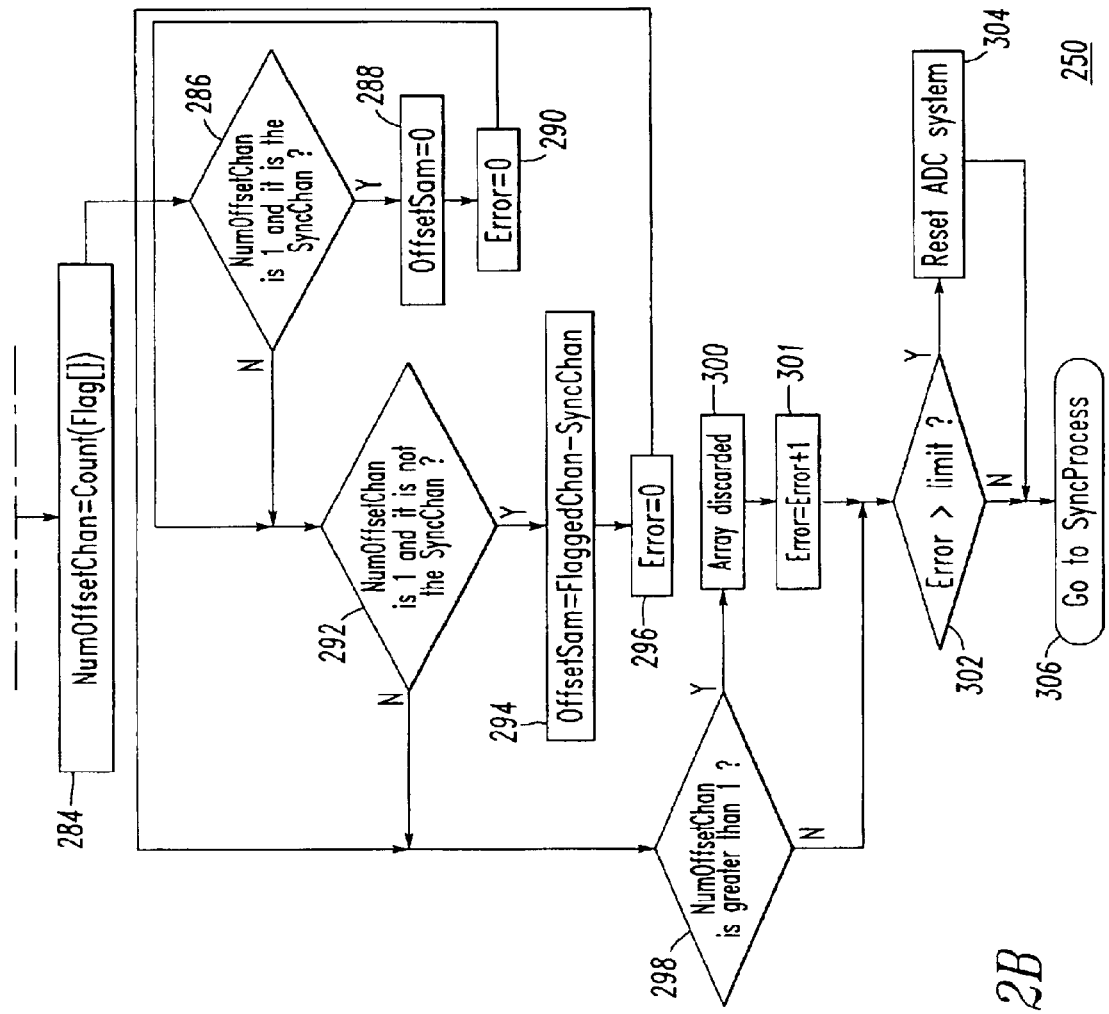

FIGS. 12A and 12B show a SyncProcess routine 250 executed by the processor 96 of FIG. 2, although this routine is applicable to any of the A/D converter systems disclosed herein. The routine 250 starts, at 252, and initializes three variables, Sample, ChanSum [] (for each channel) and ERROR, to zero, and variable "i" to one at 254. Next, at 256, the Line Frequency associated with the alternating current signals, such as the line voltage signals 48,50,52 of FIG. 2, is determined. For example, a predetermined frequency value from memory 94 may be employed. Alternatively, the average cycle time of the alternating current signals may be suitably determined and inverted, in order to obtain the average frequency value.

At 258, a preferably integer count of cycles in a predetermined measurement period is determined based upon the Line Frequency. For example, if the predetermined measurement period is selected to be 200 ms, then the integer count of line cycles (CyclesPer200 ms) would be 10 line cycles at 50 Hz or 12 line cycles at 60 Hz. An important aspect of the routine 250 is the measurement of the DC component of the alternating current signals based upon an average over an integer number of line cycles. This may be accomplished, for example, by sampling at a suitably precise, predetermined count of samples per cycle (e.g., without limitation, SamPerCycle=64,128,256 samples per cycle) or by using a relatively large count of samples per cycle, in order that one sample time results in a negligible error. For the purpose of DC offset keying based upon the DC biased signal 70 of FIG. 2, the precision is not critical. However, for other purposes, accurate removal of the DC component may be desirable.

For the first input channels, such as 44 of FIG. 2, with typically zero DC offset, the average value of the corresponding AC data is accumulated over the period of an integer number of line cycles. For example, the data is accumulated over the period of 200 ms to account for both 50 Hz and 60 Hz applications (e.g., 10 and 12 cycles, respectively).

At 260, it is determined whether the variable, Sample, is less than the product of CyclesPer200 ms and SamPerCycle. If not, then execution resumes at step 272. Otherwise, further samples are stored and accumulated. At 261, the variable j is set equal to zero. Next, at 262, it is determined whether the variable j, which was initialized to zero at step 261, is between 0 and one less than the count of channels, NumChan (e.g., 6 as shown in FIG. 3; any suitable channel count). If not, then the variable, Sample, is incremented, at 264, before step 260 is repeated.

Otherwise, at 266, the variable SerialADCval is determined from a StoredSample array 267 in the memory 94 of FIG. 2. For example, the array 267 may be a two-dimensional array, Array[i][j], wherein "i"is the sample-time index (e.g., ranging from "i"=0 to the count of 200 ms batches in the memory 94) and "j" is the channel number (e.g., ranging from "j"=0 to the count of channels less one). The StoredSample array 267 is indexed, at 266, by i*Sample+j. If there are samples for more than one measurement period in the memory array 267 (e.g., a circular buffer), then "i" is suitably controlled outside of the routine 250, in order to point to the corresponding measurement period of interest. Alternatively, the variable "i" need not be employed if samples from only one measurement period are in the memory array 267. Next, at 268, the variable SerialADCval is added to an intermediate channel sum value, ChanSum[j], for the current channel of interest, j. Then, at 270, the variable j is incremented before step 262 is repeated.

At 272, the variable j is re-initialized to zero. Then, step 274 determines the average value, ChanAvg[j] for the current channel of interest, j, based upon the final channel sum value, ChanSum[j], from step 268, divided by the count of samples, Sample, from step 264. Next, at 276, it is determined if the ChanAvg[j] for the current channel is greater than a predetermined threshold value (e.g., without limitation, 5% of the full scale (FS) value). If so, then a flag for the current channel of interest, Flag[j], is set true at 278. Otherwise, or after 278, it is determined, at 280, if the current channel of interest, j, is less than the count of channels, NumChan, less one. If so, then the variable j is incremented, at 282, before step 274 is repeated.

Even steps 274–282 average the samples from each of the A/D channels. Step 276 identifies all channels having at least a predetermined DC offset. In practice, all non-intentional DC offsets are effectively cancelled by suitable calibration settings in the A/D converter 40, in order that the net DC offset on all channels is about zero. If, however, the samples for the different channels are shifted, then the purposefully offset synchronization channel 46 of FIG. 2 and at least one other channel will have a significant DC offset (e.g., about 5% FS or greater) as detected at step 276.

After all of the channels have been considered, at 284, a count, NumOffsetChan, of the channels having a significant DC offset is determined based upon a count (e.g., zero, one or more) of the flags, Flag[], which are true. At 286, it is determined if NumOffsetChan is equal to one and if the Flag[] for the channel having the intentional DC offset (e.g., Flag[5] for channel 102 of FIG. 3, wherein $0 \le j \le 5$ for that six-channel system) is true. If so, since this is the normally expected situation, the variables OffsetSam and Error are reset to zero at 288 and 290, respectively.

Otherwise, or after 290, at 292, it is determined if NumOffsetChan is equal to one and if the Flag[] for the channel having the intentional DC offset is false (or if any one of the other Flag[] variables is true). Here, if only one channel has a significant DC offset and it is the wrong channel, then a shifted count of samples is known and can be accommodated. For example, if the sixth channel (j=5) is the channel with the intentional DC offset and the third channel (j=2) appears to have a significant DC offset, then the synchronization may be corrected by subtracting three (i.e. −3=2−5 for this example) from the memory pointer (e.g., i*sample +j), thereby rearranging the samples in the array 267 in memory 94. If the test at 292 is true, then there has been a synchronization error and, at 294, the variable OffsetSam is set equal to the variable FlaggedChan (e.g., the value of j such that Flag[j] is true) less the variable SyncChan (e.g., 5 for channel 102 of FIG. 3). Then, at 296, the variable Error is reset to zero.

The following describes how the variable OffsetSam may be used. If there are, for example, twelve channels, then the array 267 of FIG. 2 normally contains the following sequence of channel data: "0,1,2,3,4,5,6,7,8,9,10,11,0,1,2,3, 4,5,6,7,8,9,10,11, . . . ". If, as a further example, the channel #5 is the synchronization channel (i.e., having the normally expected DC offset), while channel #2 is the channel with the detected DC offset, then the channel sampling is off by three sample times. In other words, OffsetSam=−3=2−5, for this example. Hence, the correct channel data is indexed by i*Sample+j+OffsetSam.

Otherwise, or after 296, at 298, it is determined if NumOffsetChan (i.e., the count of channels, including the SyncChan, having an offset) is greater than one. If so, then either an extra sample or a missing sample has occurred within the last measurement period (e.g., 200 ms). This means that a non-recoverable (e.g., not recoverable in real-time with minimal processing resources) sampling error has occurred within the last measurement period. As a result, all data in the StoredSample array 267 in the memory 94 for that period is responsively discarded at 300. Next, at 301, the variable Error is incremented.

Otherwise, or after 301, it is determined, at 302, if the variable Error is greater than a predetermined value, Limit (e.g., 0, 1 or more). If so, then the synchronization cannot be determined after one or more attempts, and the sampling A/D system (e.g., A/D converter 40) is reset at 304. Otherwise, or after 304, at 306, the routine 250 is repeated at 252.

Under the normally expected operation, none of the first input channels (e.g., 44 of FIG. 2) will have a DC offset value, which is greater than the predetermined value at step 276. Also, that step will determine that the second input channel (e.g., 46 of FIG. 2) has a DC offset value, which is greater than the predetermined value at step 276. In turn, the processor 96 of FIG. 2 employs all of the digital values in the array 267 for the first input channels 44 for the previous time period (e.g., 200 ms).

Under error conditions, which result in the reset (e.g., through reset input 168 of FIG. 3) of the A/D converter system, the processor 96 restarts the A/D digital conversions, the A/D converter 40 (FIG. 2) serially communicates the output digital values on output 84 for a subsequent set of the A/D conversions, the DSP 88 serially receives the serially communicated output digital values through the serial port 90, and the DMA controller 92 stores the corresponding input digital values 99 in the memory 94 for each of the first and second input channels (e.g., 44 and 46 of FIG. 2).

EXAMPLE 2

For a metering application, one or two of the single AD73360L A/D converter 40' of FIG. 3 may be employed to measure the voltages and currents in all phases of a plural-phase power supply (not shown). The simultaneous sampling architecture of the converter 40' is ideal for this application where simultaneous sampling is critical to maintaining the relative phase information between the plural voltage and current phases. For example, two or more A/D channels may be employed to measure the voltages in each phase via the circuit 152 of FIG. 4. Two or more A/D channels may be employed to measure the current flowing in each phase via the circuit 154 of FIG. 8. Alternatively, any suitable current-sensing isolation amplifiers and/or Hall-effect sensors may be employed. In turn, a suitable processor, such as the DSP 88 of FIG. 2, is employed to perform the mathematical calculations on the digital values provided by the A/D converter 40'.

EXAMPLE 3

Figure 13:
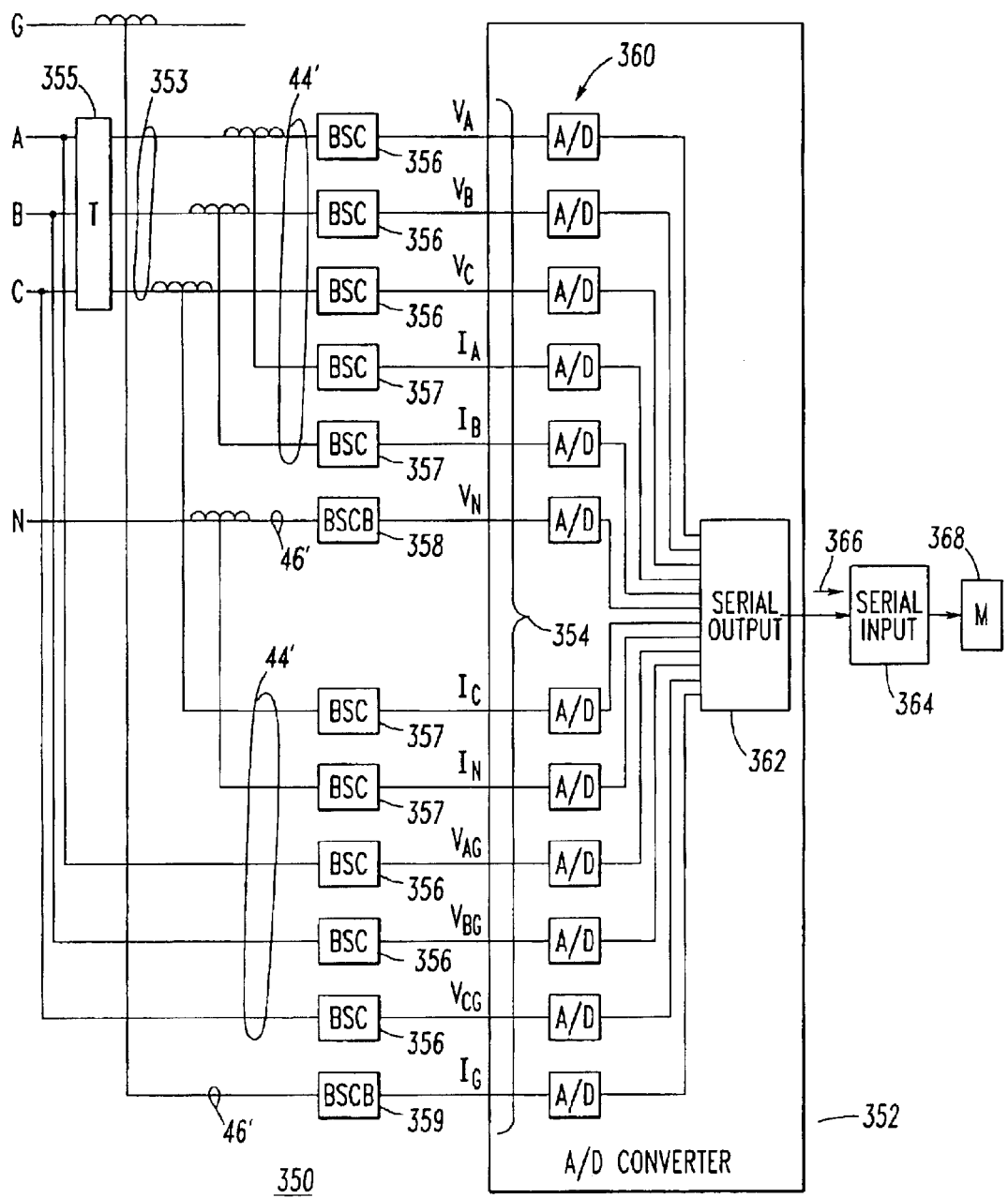
FIGS. 13 and 14 are block diagrams of plural channel serial output A/D converters and systems in accordance with other embodiments of the invention.

FIG. 13 shows an example meter 350 including an A/D converter 352 having 12 channels 354 for a three-phase power line 353. The channels 354 input three phase voltages $V_A$, $V_B$, $V_C$, one neutral voltage $V_N$, three phase currents $I_A$, $I_B$, $I_C$, one neutral current $I_N$, one ground current $I_G$, and three additional phase voltages $V_{AG}$, $V_{BG}$, $V_{CG}$, which are referenced, for example, on the primary side of a transformer (T) 355. All of the channels 354 are associated with alternating current signals having a direct current value of about zero. All but one or two of these channels 354 are part of first channels 44', which employ biasing and scaling circuits (BSCs) 356,357, which input a corresponding one of the alternating current line voltage signals and the alternating current line current signals, and which output a corresponding analog output. Preferably, one (or both) of the neutral voltage $V_N$ and the ground current $I_G$ are associated with a second channel 46' and biasing and scaling circuits (BSCBs) 358,359 employing a predetermined direct current bias value, which is different than zero. The A/D converter 352 employs a plurality of analog-to-digital (A/D) converters 360 each of which inputs a corresponding one of the analog outputs of the biasing and scaling circuits 356,357, 358,359 and outputs a corresponding digital value. The A/D converter 352 includes a serial output circuit 362 serially communicating the corresponding digital values for a first set of analog to digital conversions before serially communicating the digital values for a subsequent second set of the analog to digital conversions without providing any synchronization of the corresponding digital values for both of the first and second sets of the analog to digital conversions. A suitable serial input circuit 364 serially receives the serially communicated digital values 366 and saves the same in a memory (M) 368.

EXAMPLE 4

Figure 14:
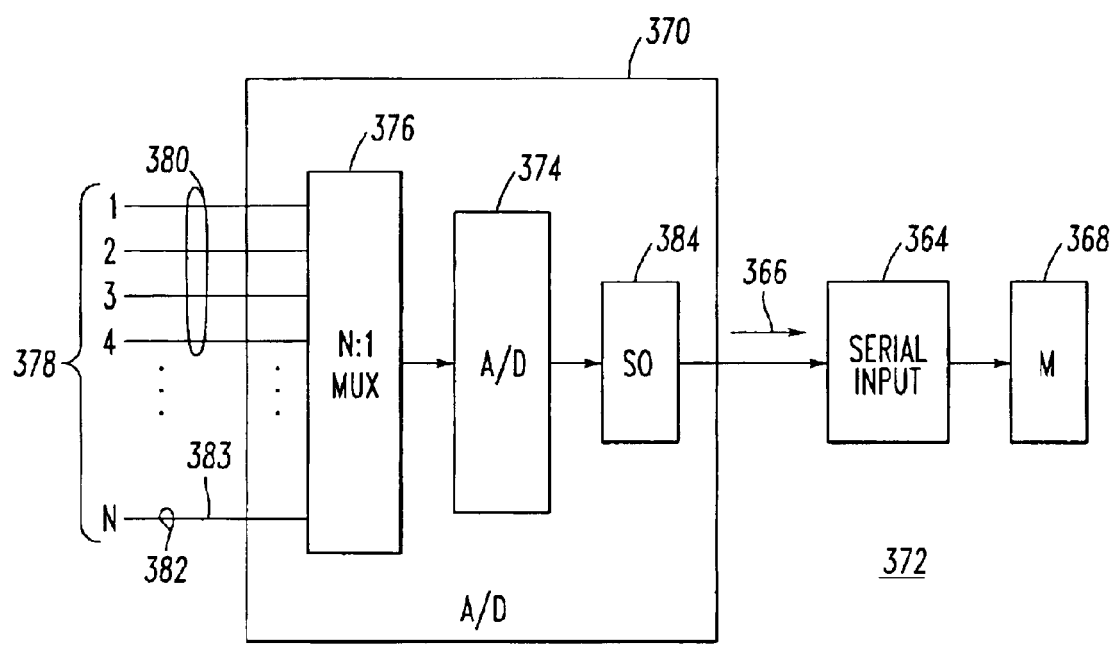

FIG. 14 shows another plural channel serial output A/D converter 370 and system 372. Here, the A/D converter 370 includes a single analog-to-digital (A/D) converter 374 having an analog multiplexer 376 with a plurality of analog inputs 378, with each of the analog inputs 378 corresponding to one of the first and second input channels 380,382. The channel 382 includes an alternating current signal having a DC offset. A serial output (SO) circuit 384 outputs the digital values 366 to the serial input circuit 364.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An analog-to-digital converter apparatus comprising:

a plurality of first input channels, each of said first input channels including an alternating current signal having a direct current value of about zero;

a second input channel having a predetermined direct current bias value, which is different than zero;

means for biasing and scaling each of said first and second input channels and providing a plurality of analog outputs;

means for providing a plurality of analog to digital conversions for each of said analog outputs and outputting a plurality of digital values;

means for serially communicating the digital values for a first set of said analog to digital conversions before serially communicating the digital values for a subsequent second set of said analog to digital conversions without providing any synchronization of the digital values for both of the first and second sets of said analog to digital conversions; and means for serially receiving the serially communicated digital values and saving the same.

2. The analog-to-digital converter apparatus of claim 1 wherein said first input channels include a plurality of alternating current line voltage signals.

3. The analog-to-digital converter apparatus of claim 1 wherein said first input channels include a plurality of alternating current line current signals.

4. The analog-to-digital converter apparatus of claim 1 wherein said second input channel includes an alternating current line voltage signal.

5. The analog-to-digital converter apparatus of claim 4 wherein said alternating current line voltage signal has a direct current value of about zero; and wherein said second input channel is biased by a predetermined direct current bias value, which is different than zero.

6. The analog-to-digital converter apparatus of claim 1 wherein said second input channel includes an alternating current line current signal.

7. The analog-to-digital converter apparatus of claim 6 wherein said alternating current line current signal has a direct current value of about zero; and wherein said second input channel is biased by a predetermined direct current bias value, which is different than zero.

8. The analog-to-digital converter apparatus of claim 1 wherein said second input channel includes a predetermined direct current voltage.

9. The analog-to-digital converter apparatus of claim 1 wherein said second input channel includes an alternating current signal having a direct current value of about zero; and wherein said second input channel is biased by a predetermined direct current value, which is different than zero.

10. The analog-to-digital converter apparatus of claim 1 wherein said means for serially communicating includes an output having a serial stream of said digital values.

11. The analog-to-digital converter apparatus of claim 1 wherein said means for providing a plurality of analog to digital conversions includes a plurality of analog to digital converters, with each of said analog to digital converters corresponding to one of said first and second input channels.

12. The analog-to-digital converter apparatus of claim 1 wherein said means for providing a plurality of analog to digital conversions includes a single analog to digital converter having an analog multiplexer with a plurality of analog inputs, with each of said analog inputs corresponding to one of said first and second input channels.

13. The analog-to-digital converter apparatus of claim 1 wherein said means for serially receiving the serially communicated digital values is a digital signal processor.

14. The analog-to-digital converter apparatus of claim 13 wherein said digital signal processor includes a serial port, a direct memory access controller, a memory and a processor.

15. A method of analog-to-digital conversion, said method comprising:
    employing a plurality of first input channels, each of said first input channels including an alternating current signal having a direct current value of about zero;
    employing a second input channel having a predetermined direct current bias value, which is different than zero;
    biasing and scaling each of said first input channels and providing a plurality of analog outputs;
    providing a plurality of analog to digital conversions for each of said analog outputs and said second input channel and outputting a plurality of output digital values;
    serially communicating the output digital values for a first set of said analog to digital conversions before serially communicating the output digital values for a subsequent second set of said analog to digital conversions without providing any synchronization of the digital values for both of the first and second sets of said analog to digital conversions;
    serially receiving the serially communicated output digital values and storing corresponding input digital values for each of the first and second input channels; and
    processing said input digital values.

16. The method of claim 15 further comprising
    averaging said input digital values for each of the first and second input channels; and
    identifying from said averaged input digital values one or more of the first and second input channels having a direct current offset value, which is greater than a predetermined value.

17. The method of claim 16 further comprising
    inputting a plurality of alternating current line signals at the first input channels;
    employing a line cycle with said line signals;
    selecting a time period corresponding to an integer count of said line cycle; and
    averaging said input digital values over said time period.

18. The method of claim 17 further comprising
    employing 200 ms as said time period.

19. The method of claim 16 further comprising
    employing a full scale value associated with the alternating current signals of said first input channels; and
    employing about five percent of said full scale value as said predetermined value.

20. The method of claim 16 further comprising
    determining whether one or more of the first input channels has a direct current offset value, which is greater than said predetermined value.

21. The method of claim 20 further comprising
    determining that the second input channel has a direct current offset value, which is less than said predetermined value;
    determining that only one of the first input channels has the direct current offset value, which is greater than said predetermined value; and
    responsively rearranging the input digital values for said first input channels for said time period.

22. The method of claim 20 further comprising
    determining that none of the first input channels has the direct current offset value, which is greater than said predetermined value;
    determining that the second input channel has a direct current offset value, which is greater than said predetermined value; and
    employing the input digital values for said first input channels for said time period.

23. The method of claim 20 further comprising
    determining that more than one of the first input channels has the direct current offset value, which is greater than said predetermined value; and
    responsively discarding the input digital values for said first input channels for said time period.

24. The method of claim 23 further comprising
    restarting said analog to digital conversions;
    serially communicating the output digital values for a subsequent set of said analog to digital conversions; and serially receiving the serially communicated output digital values; and storing corresponding input digital values in a memory for each of the first and second input channels.

25. A meter for a plurality of power lines, said meter comprising:

a plurality of first input channels, each of said first input channels including an alternating current signal having a direct current value of about zero, said first input channels include a plurality of alternating current line voltage signals and a plurality of alternating current line current signals;

a second input channel having an analog output with a predetermined direct current bias value, which is different than zero;

a plurality of biasing and scaling circuits each of which inputs a corresponding one of said alternating current line voltage signals and said alternating current line current signals, and outputs a corresponding analog output;

a plurality of analog to digital converters each of which inputs a corresponding one of said analog outputs of said biasing and scaling circuits and said second input channel and outputs a corresponding digital value;

a serial output circuit serially communicating the corresponding digital values for a first set of analog to digital conversions before serially communicating the digital values for a subsequent second set of said analog to digital conversions without providing any synchronization of the corresponding digital values for both of the first and second sets of said analog to digital conversions;

a memory; and a serial input circuit serially receiving the serially communicated digital values and saving the same in said memory.

26. The meter of claim 25 wherein said alternating current line voltage signals have an alternating current voltage; and wherein said biasing and scaling circuits for said alternating current line voltage signals include a divider having an output, which reduces the alternating voltage of the corresponding alternating current line voltage signal, and a resistor between the output of said divider and a direct current reference voltage, which biases said output to be at least zero volts.

27. The meter of claim 26 wherein said second input channel receives a voltage signal having a value of about zero, said second input channel including a biasing and scaling circuit having a divider with an output, and a resistor between the output of said divider of said second input channel and a direct current reference voltage, which biases the output of said divider of said second input channel to be a predetermined voltage.

28. The meter of claim 25 wherein said alternating current line current signals have an alternating current; and wherein said biasing and scaling circuits for said alternating current line current signals include a current transformer having a secondary and a burden resistor with first and second terminals which are electrically connected in parallel with said secondary, said second terminal being biased by a direct current reference voltage.

29. The meter of claim 28 wherein said second input channel includes a biasing and scaling circuit for an alternating current line current signal having a value of about zero and a current transformer having a secondary and a burden resistor with first and second terminals which are electrically connected in parallel with the secondary of the current transformer of said second input channel, said second terminal of the burden resistor of said second input channel being biased by the direct current reference voltage, the first terminal of the burden resistor of said second input channel being electrically connected by a resistor to a ground, which biases the analog output of said second input channel to a predetermined voltage.

* * * * *